United States Patent
Wang et al.

(10) Patent No.: US 9,698,367 B2
(45) Date of Patent: Jul. 4, 2017

(54) FLEXIBLE ELECTRODE AND METHOD FOR MANUFACTURING THE SAME, ELECTRONIC SKIN AND FLEXIBLE DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Jiaheng Wang, Beijing (CN); Feng Bai, Beijing (CN); Jiuxia Yang, Beijing (CN); Jiantao Liu, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 14/892,543

(22) PCT Filed: Apr. 15, 2015

(86) PCT No.: PCT/CN2015/076633
§ 371 (c)(1),
(2) Date: Nov. 19, 2015

(87) PCT Pub. No.: WO2016/090796
PCT Pub. Date: Jun. 16, 2016

(65) Prior Publication Data
US 2016/0359133 A1    Dec. 8, 2016

(30) Foreign Application Priority Data
Dec. 10, 2014    (CN) .......................... 2014 1 0759065

(51) Int. Cl.
*H01L 33/42* (2010.01)
*H01L 51/52* (2006.01)
(Continued)

(52) U.S. Cl.
CPC ...... *H01L 51/5206* (2013.01); *H01L 51/0021* (2013.01); *H01L 51/0035* (2013.01);
(Continued)

(58) Field of Classification Search
CPC ............................ H01L 33/42; H01L 51/5203
See application file for complete search history.

(56) References Cited

U.S. PATENT DOCUMENTS 7,438,832 B2 * 10/2008 Majumdar ........... C08K 5/0091
                                                     252/500
7,750,555 B2 *  7/2010 Song ..................... H01B 1/127
                                                     313/500
(Continued)

FOREIGN PATENT DOCUMENTS

CN    101085857    12/2007
CN    101384515     3/2009
(Continued)

OTHER PUBLICATIONS

Marsh et al., "Room Temperature Ionic Liquids and Their Mixtures—A Review", Elsevier, Feb. 2004, pp. 93-98.*
(Continued)

*Primary Examiner* — Evan Pert
(74) *Attorney, Agent, or Firm* — Blakely Sokoloff Taylor & Zafman LLP

(57) ABSTRACT

The present disclosure relates to a flexible electrode and a method for manufacturing the same, an electronic skin and a flexible display device, the conductive polymer is solution treated by the ionic liquid, the nano-metal material is added to the solution treated conductive polymer to form the (Continued)

dispersed liquid of the conductive polymer containing the nano-metal material, the dispersed liquid is transferred to the substrate for curing to obtain the flexible electrode. The flexible electrode makes use of the flexible property of the conductive polymer such that the formed flexible electrode has good ductility and resilience. And the nano-metal material is dispersed in the conductive polymer such that the nano-metal material remedies the defect of low conductive property of the conductive polymeric material, and the flexible electrode has good conductivity.

19 Claims, 1 Drawing Sheet

(51) Int. Cl.
*H01L 51/56* (2006.01)
*H01L 51/00* (2006.01)
(52) U.S. Cl.
CPC ...... *H01L 51/0036* (2013.01); *H01L 51/5203* (2013.01); *H01L 51/5221* (2013.01); *H01L 51/56* (2013.01); *H01L 2251/301* (2013.01); *H01L 2251/5338* (2013.01); *H01L 2251/5369* (2013.01)

(56) References Cited

U.S. PATENT DOCUMENTS

| | | | | |
|---|---|---|---|---|
| 2010/0068461 | A1* | 3/2010 | Wallace | B81C 1/00111 428/156 |
| 2013/0285041 | A1 | 10/2013 | Suematsu et al. | |
| 2014/0226201 | A1* | 8/2014 | Posset | G02F 1/153 359/296 |
| 2014/0303470 | A1* | 10/2014 | Tsukada | A61B 5/0408 600/377 |
| 2016/0057835 | A1* | 2/2016 | Wang | H05B 33/26 313/503 |
| 2016/0114395 | A1* | 4/2016 | Kim | B22F 9/20 252/514 |

FOREIGN PATENT DOCUMENTS

| | | |
|---|---|---|
| CN | 102800809 | 11/2012 |
| CN | 102953137 | 3/2013 |
| CN | 103493145 | 1/2014 |
| CN | 104040642 | 9/2014 |
| CN | 104393194 | 3/2015 |
| KR | 102012000357 | 1/2012 |
| KR | 101516474 | 5/2015 |
| TW | 201440276 | 10/2014 |

OTHER PUBLICATIONS

Office Action in Chinese Application No. 201410759065.4 dated Jun. 15, 2016, and English translation. 11 pages.
Chinese Office Action with English Language Translation, dated Apr. 12, 2016, Chinese Application No. 201410759065.4.
International Search Report and Written Opinion with English Language Translation, dated Sep. 22, 2015, Application No. PCT/CN2015/076633.
Decision on Rejection in Chinese Application No. 201410759065.4 dated Jan. 6, 2017, with English translation. 16 pages.

* cited by examiner

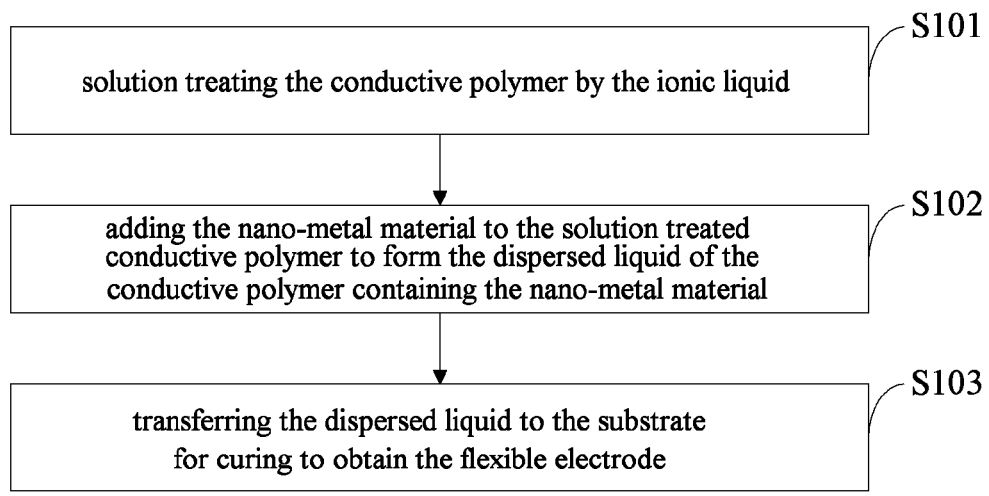

FLEXIBLE ELECTRODE AND METHOD FOR MANUFACTURING THE SAME, ELECTRONIC SKIN AND FLEXIBLE DISPLAY DEVICE

FIELD OF THE DISCLOSURE

The present disclosure relates to the field of display technology, and more particularly to a flexible electrode and a method for manufacturing the same, an electronic skin and a flexible display device.

BACKGROUND OF THE DISCLOSURE

A flexible display technology, which is mainly a flexible electronic technology, is to install flexible display medium electronic elements and materials on a flexible or a flectional substrate so that the display has the characteristic of being bended or rolled into any shape and is characterized by being light-weighted, thin and portable.

The electrodes currently used in flexible displays are made of a single-layered conductive metal oxide material, mostly an ITO material, the conductive property of which is influenced by the flectional, foldable and ductile properties required for flexible display. Thus, how to achieve ductility and resilience of electrodes to satisfy the flexible requirement for flexible display while ensuring the conductive property thereof is the technical problem that needs to be solved urgently by those skilled in the art.

With the popularization and promotion of intelligent technologies, a remote medical technology is becoming a new medical technology, and corresponding intelligent devices have been developed and applied gradually in the market. However, electronic devices for human detection need to tightly fit human bodies, which requires that sensing electrodes of electronic devices, namely electronic skin, should be flexible and better fit human bodies. Thus, how to make sensing electrodes with flexibility and satisfactory conductive property is the technical problem that needs to be solved urgently by those skilled in the art.

SUMMARY OF THE DISCLOSURE

To this end, the present disclosure provides a flexible electrode and a method for manufacturing the same, an electronic skin and a flexible display device in order to make a flexible electrode with both flexibility and conductive property, which is applicable in the flexible display device, or applicable as an electronic skin in a sensing electrode of an electronic device that is in contact with human bodies.

Thus, the flexible electrode according to an example of the present disclosure comprises a body made of a conductive polymeric material, in which nano-metal materials are dispersed.

In an implementable mode, the conductive polymeric material in the flexible electrode according to the example of the present disclosure comprises at least one of polyacetylene, polythiophene, polypyrrole, polyaniline, polyphenylene, polyphenylene acetylene, and polydiacetylene.

In an implementable mode, the nano-metal material in the flexible electrode according to the example of the present disclosure comprises at least one of gold nanoparticles, silver nanoparticles and copper nanoparticles.

In an implementable mode, the nano-metal material in the flexible electrode according to the example of the present disclosure has a particle size ranging from 10 nm to 50 nm.

In an implementable mode, the weight ratio of the nano-metal material to the conductive polymeric material in the flexible electrode according to the example of the present disclosure ranges from 1:15 to 1:5.

In an implementable mode, the conductive polymeric material in the flexible electrode according to the example of the present disclosure is the one treated by an ionic liquid.

In an implementable mode, the ionic liquid in the flexible electrode according to the example of the present disclosure comprises at least one of 1-ethyl-3-methylimidazolium hexafluorophosphate, 1-butyl-3-methylimidazolium hexafluorophosphate, 1-octyl-3-methylimidazolium hexafluorophosphate, 1-ethyl-3-methylimidazolium tetrafluoroborate, 1-butyl-3-methylimidazolium trifluoromethanesulfonate, 1-butyl-3-methylimidazolium chloride.

In an implementable mode, the weight ratio of the ionic liquid to the conductive polymeric material in the flexible electrode according to the example of the present disclosure ranges from 5:1 to 15:1.

A method for manufacturing a flexible electrode according to an example of the present disclosure comprises the steps of:

solution treating a conductive polymer by an ionic liquid;

adding a nano-metal material to the solution treated conductive polymer to form a dispersed liquid of the conductive polymer containing the nano-metal material; and transferring the dispersed liquid to a substrate for curing to form a flexible electrode.

In an implementable mode, the step of transferring the dispersed liquid to a substrate in the method for manufacturing the flexible electrode according to the example of the present disclosure particularly comprises the steps of:

transferring the dispersed liquid to a carrier; and transfer printing the carrier bearing the dispersed liquid onto the substrate.

In an implementable mode, in the method for manufacturing the flexible electrode according to the example of the present disclosure, the surface of the carrier has a predetermined pattern.

In an implementable mode, the conductive polymer in the method for manufacturing the flexible electrode according to the example of the present disclosure comprises at least one of polyacetylene, polythiophene, polypyrrole, polyaniline, polyphenylene, polyphenylene acetylene, and polydiacetylene.

In an implementable mode, the ionic liquid in the method for manufacturing the flexible electrode according to the example of the present disclosure comprises at least one of 1-ethyl-3-methylimidazolium hexafluorophosphate, 1-butyl-3-methylimidazolium hexafluorophosphate, 1-octyl-3-methylimidazolium hexafluorophosphate, 1-ethyl-3-methylimidazolium tetrafluoroborate, 1-butyl-3-methylimidazolium trifluoromethanesulfonate, 1-butyl-3-methylimidazolium chloride.

In an implementable mode, the weight ratio of the ionic liquid to the conductive polymer in the method for manufacturing the flexible electrode according to the example of the present disclosure ranges from 5:1 to 15:1.

In an implementable mode, the nano-metal material in the method for manufacturing the flexible electrode according to the example of the present disclosure comprises at least one of gold nanoparticles, silver nanoparticles and copper nanoparticles.

In an implementable mode, the weight ratio of the nano-metal material to the conductive polymer in the method for manufacturing the flexible electrode according to the example of the present disclosure ranges from 1:15 to 1:5.

In an implementable mode, the nano-metal material in the method for manufacturing the flexible electrode according to the example of the present disclosure has a particle size ranging from 10 nm to 50 nm.

According to the example of the present disclosure, there is also provided a flexible display device comprising a flexible substrate, on which a first electrode, a light-emitting layer and a second electrode are arranged successively, wherein the first electrode and the second electrode are the flexible electrodes according to the example of the present disclosure.

The example of the present disclosure also provides a display device comprising the flexible display device according to the example of the present disclosure.

The example of the present disclosure also provides an electronic skin comprising the flexible electrode according to the example of the present disclosure.

The advantageous effects of the example of the present disclosure comprise that:

the present disclosure provides a flexible electrode and a method for manufacturing the same, an electronic skin and a flexible display device, the conductive polymer is solution treated by the ionic liquid, the nano-metal material is added to the solution treated conductive polymer to form the dispersed liquid of the conductive polymer containing the nano-metal material, the dispersed liquid is transferred to the substrate for curing to obtain the flexible electrode which body is made of a conductive polymeric material, and the nano-metal material is dispersed in the conductive polymeric material. The flexible electrode makes use of the flexible property of the conductive polymer such that the formed flexible electrode has good ductility and resilience. And during the process of making the flexible electrode, the nano-metal material is dispersed in the conductive polymer such that the nano-metal material remedies the defect of low conductive property of the conductive polymeric material, and the flexible electrode has good conductivity. Thus, the flexible electrode has both good flexibility and excellent conductivity, and can be widely applied not only as an electrode in flexible display devices but also as an electronic skin in electronic devices for human detection.

BRIEF DESCRIPTION OF DRAWINGS

FIG. 1 is a flow chart showing the method for manufacturing a flexible electrode according to an example of the present disclosure.

DETAILED DESCRIPTION OF THE DISCLOSURE

The embodiments of a flexible electrode and a method for manufacturing the same, an electronic skin and a flexible display device provided by the present disclosure will be explained in detail with reference to the drawings.

The flexible electrode provided by an example of the present disclosure comprises a body made of a conductive polymeric material that is dispersed with a nano-metal material.

The flexible electrode provided by an example of the present disclosure makes use of the flexible property of the conductive polymer such that the formed flexible electrode has good ductility and resilience, and the nano-metal material is dispersed in the conductive polymer such that the nano-metal material remedies the defect of low conductive property of the conductive polymeric material, and the flexible electrode has good conductivity. Thus, the flexible electrode has both good flexibility and excellent conductivity, and can be widely applied not only as an electrode in flexible display devices but also as an electronic skin in electronic devices for human detection.

Upon implementation, since it is very likely that the flexible electrode is applied in the flexible display device, the flexible electrode is required to have good light transmittance and therefore the conductive polymeric material is usually made of a transparent material, to be specific, the conductive polymeric material can comprise at least one of polyacetylene, polythiophene, polypyrrole, polyaniline, polyphenylene, polyphenylene acetylene, and polydiacetylene.

Upon implementation, the nano-metal material used in the flexible electrode provided by an example of the present disclosure can comprise at least one of gold nanoparticles, silver nanoparticles and copper nanoparticles, and preferably, a gold nanoparticle material is used. To ensure that the manufactured flexible electrode has good light transmittance and conductivity, the nano-metal material preferably has a particle size ranging from 10 nm to 50 nm.

Particularly, in the flexible electrode provided by an example of the present disclosure, the weight ratio of the nano-metal material to the conductive polymer usually ranges from 1:15 to 1:5, and preferably, if gold nanoparticles are used as the nano-metal material, then the manufactured flexible electrode has the best conductivity when the weight ratio of the gold nanoparticles to the conductive polymer is 1:10.

The following table 1 shows the testing results concerning conductivity, ductility and transmission of the flexible electrode made by mixed gold nanoparticles of different particle sizes and the conductive polymer.

TABLE 1

| Sample No. | Particle size of gold nanoparticles (nm) | The weight ratio of the gold nanoparticles to the conductive polymer | Sheet resistance Ω/□ | Ductility (%) | Transmission (%) |
|---|---|---|---|---|---|
| 1 | 10 | 1:10 | 9 | 330 | 95 |
| 2 | 20 | 1:15 | 14 | 350 | 93 |
| 3 | 30 | 1:8 | 16 | 285 | 90 |
| 4 | 50 | 1:5 | 20 | 210 | 87 |

It can be known from the testing results in Table 1 that the flexible electrode has the best transmission when it is made with the weight ratio of the gold nanoparticles having a particle size of 10 nm to the conductive polymer being 1:10.

Further, the conductive polymeric material is usually strongly adhesive. If the nano-metal material is directly dispersed in the conductive polymeric material, the nano material in the formed flexible electrode tends to accumulate in the conductive polymeric material, which fails to achieve the effect of enhancing the conductivity. Thus, the conductive polymeric material in the flexible electrode provided by an example of the present disclosure is usually the one treated by the ionic liquid so as to render the nano-metal material easily dispersed in the conductive polymeric material.

Specifically, the ionic liquid can comprise at least one of 1-ethyl-3-methylimidazolium hexafluorophosphate, 1-butyl-3-methylimidazolium hexafluorophosphate, 1-octyl-3-methylimidazolium hexafluorophosphate, 1-ethyl-3-methyl-imidazolium tetrafluoroborate, 1-butyl-3-methylimidazolium trifluoromethanesulfonate, 1-butyl-3-methylimidazolium chloride.

Moreover, the weight ratio of the ionic liquid to the conductive polymer usually ranges from 5:1 to 15:1 such that the nano-metal material can be better dispersed in the conductive polymeric material treated by the ionic liquid.

The following table 2 shows the testing results of dispersion of the nano-metal material in different conductive polymers treated by different ionic liquids.

TABLE 2

| sample No. | nano-metal material (20 nm) | conductive polymeric material | ionic liquid material | the weight ratio of the ionic liquid to the conductive polymer to the nano metal | tested property (D50) (nm) |
|---|---|---|---|---|---|
| 1 | gold nanoparticles | polythiophene | none | 0:15:1 | 62 |
| 2 | gold nanoparticles | polythiophene | 1-butyl-3-methylimidazolium hexafluorophosphate | 15:1:0.125 | 28 |
| 3 | gold nanoparticles | polyaniline | 1-butyl-3-methylimidazolium trifluoromethanesulfonate | 10:1:0.1 | 17 |
| 4 | gold nanoparticles | polypyrrole | 1-butyl-3-methylimidazolium chloride | 5:1:0.1 | 29 |
| 5 | silver nanoparticles | polyaniline | none | 0:15:1 | 83 |
| 6 | silver nanoparticles | polyaniline | 1-butyl-3-methylimidazolium hexafluorophosphate | 15:1:0.125 | 35 |
| 7 | silver nanoparticles | polypyrrole | 1-butyl-3-methylimidazolium trifluoromethanesulfonate | 10:1:0.1 | 18 |
| 8 | silver nanoparticles | polypyrrole | 1-butyl-3-methylimidazolium chloride | 5:1:0.1 | 32 |
| 9 | copper nanoparticles | polypyrrole | none | 0:15:1 | 75 |
| 10 | copper nanoparticles | polypyrrole | 1-butyl-3-methylimidazolium hexafluorophosphate | 15:1:0.125 | 30 |
| 11 | copper nanoparticles | polythiophene | 1-butyl-3-methylimidazolium trifluoromethanesulfonate | 10:1:0.1 | 19 |
| 12 | copper nanoparticles | polythiophene | 1-butyl-3-methylimidazolium chloride | 5:1:0.1 | 30 |

It can be known from the testing results in Table 2 obtained by measuring the average particle size (D50) of the nano-metal ions in the dispersed liquid that by comparing the testing results of the dispersion of the 20 nm nano-metal material in the conductive polymer treated by the ionic liquid with those of the dispersion of the 20 nm nano-metal material in the conductive polymer not treated by the ionic liquid, it is found that the average particle size of the former is far less than that of the latter. The best dispersion effect occurs when the nano metal is dispersed in the conductive polymer that is solved by 1-butyl-3-methylimidazolium trifluoromethanesulfonate as the ionic liquid with the weight ratio of the ionic liquid to the conductive polymer being 10:1. It is noteworthy that the less the datum indicated in the testing result, the better the dispersion effect.

An example of the present disclosure also provides a method for manufacturing a flexible electrode as shown in FIG. 1, which comprises the steps of:

S101: solution treating the conductive polymer by the ionic liquid;

S102: adding the nano-metal material to the solution treated conductive polymer to form the dispersed liquid of the conductive polymer containing the nano-metal material;

S103: transferring the dispersed liquid to the substrate for curing to obtain the flexible electrode.

The flexible electrode manufactured by the method provided by an example of the present disclosure makes use of the flexible property of the conductive polymer such that the formed flexible electrode has good ductility and resilience, and during the process of manufacturing the flexible electrode, the nano-metal material is dispersed in the conductive polymer such that the nano-metal material remedies the defect of low conductive property of the conductive polymeric material, and the flexible electrode has good conductivity. Thus, the flexible electrode manufactured by the above method has both good flexibility and excellent conductivity, and can be widely applied not only as an electrode in flexible display devices but also as an electronic skin in electronic devices for human detection.

Upon implementation, the primary material of the flexible electrode manufactured by the method provided by the example of the present disclosure is a conductive polymeric material, and since it is very likely that the manufactured flexible electrode is applied in the flexible display device, the manufactured flexible electrode is required to have good light transmittance and therefore the conductive polymeric material is usually made of a transparent material, to be specific, the conductive polymeric material can comprise at least one of polyacetylene, polythiophene, polypyrrole, polyaniline, polyphenylene, polyphenylene acetylene, and to polydiacetylene.

Further, the conductive polymeric material is usually strongly adhesive. If the nano-metal material is directly dispersed in the conductive polymeric material, the nano-metal material tends to accumulate in the conductive polymeric material, which fails to achieve the effect of enhancing the conductivity. Thus, in the manufacturing method provided by the example of the present disclosure, the step S101 needs to be performed to first solution-treat the conductive polymer by the ionic liquid so as to render the later added nano-metal material easily dispersed in the conductive polymeric material.

Specifically, the ionic liquid used in the solution treatment can comprise at least one of 1-ethyl-3-methylimidazolium hexafluorophosphate, 1-butyl-3-methylimidazolium hexafluorophosphate, 1-octyl-3-methylimidazolium hexafluorophosphate, 1-ethyl-3-methylimidazolium tetrafluoroborate, 1-butyl-3-methylimidazolium trifluoromethanesulfonate, 1-butyl-3-methylimidazolium chloride.

Moreover, the weight ratio of the ionic liquid to the conductive polymer used in the process of solution treatment usually ranges from 5:1 to 15:1. Preferably, the solution obtained using the weight ratio ranging from 8:1 to 10:1 can better facilitate the dispersion of the nano-metal material.

Specifically, in the step S102 of the manufacturing method provided by an example of the present disclosure, the nano-metal material is added to the solution-treated conductive polymer to form the dispersed liquid of the conductive polymer containing the nano-metal material, wherein the selected nano-metal material usually comprises at least one of gold nanoparticles, silver nanoparticles and copper nanoparticles. Preferably, a gold nanoparticle material can be used. In addition, to ensure that the manufactured flexible electrode has good light transmittance and conductivity, the particle size of the nano-metal material is preferably selected to range from 10 nm to 50 nm. Specifically, the weight ratio of the nano-metal material added in the step S102 to the conductive polymer usually ranges from 1:15 to 1:5. Preferably, when the gold nanoparticles are used as the nano-metal material, and the weight ratio of the gold nanoparticles to the conductive polymer is 1:10, the manufactured flexible electrode has the best conductivity.

Specifically, in the manufacturing method provided by an example of the present disclosure, after forming the dispersed liquid of the conductive polymer containing the nano-metal material, the dispersed liquid needs to be transferred to the substrate for curing to obtained the flexible electrode in the step S103. Specifically, the dispersed liquid can be transferred to the substrate by the following steps: first transferring the dispersed liquid to the carrier, and then transfer printing the carrier bearing the dispersed liquid onto the substrate.

Upon implementation, the surface of the carrier can have a predetermined pattern. When the dispersed liquid is transferred to the carrier, only the area of the carrier that has a pattern can absorb certain dispersed liquid, such that during the transfer printing onto the substrate, the carrier forms the dispersed liquid having the predetermined pattern on the substrate and then the flexible electrode having the predetermined pattern can be directly obtained through curing.

Of course, upon implementation, the surface of the carrier may also be relatively smooth, such that the dispersed liquid can be formed over the full surface of the substrate after the transfer printing from the carrier, and then after curing, the formed flexible electrode is also a full sheet. If it is desired to make a flexible electrode having a certain pattern, etching treatment has to be conducted.

Based on the same disclosure concept, the example of the present disclosure also provides an electronic skin comprising the flexible electrode provided by the above example of the present disclosure. Since the problem-solving principle of the electronic skin is similar to the above-mentioned flexible electrode, please make reference to the implementation of the flexible electrode for the implementation of the electronic skin, which will not be reiterated herein.

Based on the same disclosure concept, the example of the present disclosure also provides a flexible display device. Since the problem-solving principle of the flexible display device is similar to the above-mentioned flexible electrode, please make reference to the implementation of the flexible electrode for the implementation of the flexible display device, which will not be reiterated herein.

Specifically, the flexible display device provided by the example of the present disclosure comprises a flexible substrate, on which a first electrode, a light-emitting layer and a second electrode are arranged successively, wherein the first electrode and/or the second electrode are the flexible electrodes according to the example of the present disclosure. It shall be noted that the flexible display substrate is obtained through improvement to the current OLED display device, so the basic components thereof are substantially identical with the current OLED display devices, which will not be reiterated herein.

Based on the same disclosure concept, the example of the present disclosure also provides a display device. Since the problem-solving principle of the display device is similar to the above-mentioned flexible display device, please make reference to the implementation of the flexible display device for the implementation of the display device, which will not be reiterated herein. The display device can be any product or component that has a display function, such as mobile phones, tablets, TVs, display panels, lap-tops, digital photo frames, or navigation instruments.

The present disclosure provides a flexible electrode and a method for manufacturing the same, an electronic skin and a flexible display device, the to conductive polymer is solution treated by the ionic liquid, the nano-metal material is added to the solution treated conductive polymer to form the dispersed liquid of the conductive polymer containing the nano-metal material, the dispersed liquid is transferred to the substrate for curing to obtain the flexible electrode which body is made of a conductive polymeric material, and the nano-metal material is dispersed in the conductive polymeric material. The flexible electrode makes use of the flexible property of the conductive polymer such that the formed flexible electrode has good ductility and resilience. And during the process of making the flexible electrode, the nano-metal material is dispersed in the conductive polymer such that the nano-metal material remedies the defect of low conductive property of the conductive polymeric material, and the flexible electrode has good conductivity. Thus, the flexible electrode has both good flexibility and excellent conductivity, and can be widely applied not only as an electrode in flexible display devices but also as an electronic skin in electronic devices for human detection.

Apparently, those skilled in the art can make any modifications and variations to the present disclosure without departing from the spirit and scope of the present disclosure. If these modifications and variations of the present disclosure are within the scope of the claims of the present disclosure and equivalent technologies thereof, the present disclosure intends to include these modifications and variations.

The invention claimed is:

1. A flexible electrode, comprising a body made of a conductive polymeric material, in which a nano-metal material is dispersed;
   wherein the conductive polymeric material is a conductive polymeric material treated by an ionic liquid.

2. The flexible electrode according to claim 1, wherein the conductive polymeric material comprises at least one of polyacetylene, polythiophene, polypyrrole, polyaniline, polyphenylene, polyphenylene acetylene, and polydiacetylene.

3. The flexible electrode according to claim 1, wherein the nano-metal material comprises at least one of gold nanoparticles, silver nanoparticles and copper nanoparticles.

4. The flexible electrode according to claim 3, wherein the nano-metal material has a particle size ranging from 10 nm to 50 nm.

5. The flexible electrode according to claim 1, wherein the weight ratio of the nano-metal material to the conductive polymeric material ranges from 1:15 to 1:5.

6. The flexible electrode according to claim 1, wherein the ionic liquid comprises at least one of
1-ethyl-3-methylimidazolium hexafluorophosphate, 1-butyl-3-methylimidazolium hexafluorophosphate, 1-octyl-3-methylimidazolium hexafluorophosphate, 1-ethyl-3-methylimidazolium tetrafluoroborate, 1-butyl-3-methylimidazolium trifluoromethanesulfonate, 1-butyl-3-methylimidazolium chloride.

7. The flexible electrode according to claim 6, wherein the weight ratio of the ionic liquid to the conductive polymeric material ranges from 5:1 to 15:1.

8. A method for manufacturing a flexible electrode, comprising the steps of:
solution treating a conductive polymer by an ionic liquid;
adding a nano-metal material to the solution treated conductive polymer to form a dispersed liquid of the conductive polymer containing the nano-metal material; and
transferring the dispersed liquid to a substrate for curing to form a flexible electrode.

9. The method for manufacturing according to claim 8, wherein the step of transferring the dispersed liquid to a substrate particularly comprises the steps of:
transferring the dispersed liquid to a carrier; and
transfer printing the carrier bearing the dispersed liquid onto the substrate.

10. The method for manufacturing according to claim 9, wherein surface of the carrier has a predetermined pattern.

11. The method for manufacturing according to claim 8, wherein the conductive polymer comprises at least one of polyacetylene, polythiophene, polypyrrole, polyaniline, polyphenylene, polyphenylene acetylene, and polydiacetylene.

12. The method for manufacturing according to claim 11, wherein the ionic liquid comprises at least one of 1-ethyl-3-methylimidazolium hexafluorophosphate, 1-butyl-3-methylimidazolium hexafluorophosphate, 1-octyl-3-methylimidazolium hexafluorophosphate, 1-ethyl-3-methylimidazolium tetrafluoroborate, 1-butyl-3-methylimidazolium trifluoromethanesulfonate, 1-butyl-3-methylimidazolium chloride.

13. The method for manufacturing according to claim 12, wherein the weight ratio of the ionic liquid to the conductive polymer ranges from 5:1 to 15:1.

14. The method for manufacturing according to claim 8, wherein the nano-metal material comprises at least one of gold nanoparticles, silver nanoparticles and copper nanoparticles.

15. The method for manufacturing according to claim 14, wherein the weight ratio of the nano-metal material to the conductive polymer ranges from 1:15 to 1:5.

16. The method for manufacturing according to claim 14, wherein the nano-metal material has a particle size ranging from 10 nm to 50 nm.

17. A flexible display device comprising a flexible substrate, on which a first electrode, a light-emitting layer and a second electrode are arranged successively, wherein the first electrode is the flexible electrode according to claim 1; and wherein the second electrode is the flexible electrodes according to claim 1.

18. A display device, comprising the flexible display device according to claim 17.

19. An electronic skin, comprising the flexible electrode according to claim 1.

* * * * *

UNITED STATES PATENT AND TRADEMARK OFFICE
CERTIFICATE OF CORRECTION

PATENT NO. : 9,698,367 B2
APPLICATION NO. : 14/892543
DATED : July 4, 2017
INVENTOR(S) : Jiaheng Wang et al.

It is certified that error appears in the above-identified patent and that said Letters Patent is hereby corrected as shown below:

On the Title Page

On Page 2, item (56) under Foreign Patent Documents, Line 6, delete "KR 102012000357 1/2012" and insert -- KR 1020120003577 1/2012 --

In the Claims

Column 10, Line 28, Claim 17, Line 5, delete "electrodes" and insert -- electrode --

Signed and Sealed this
Nineteenth Day of December, 2017

Joseph Matal
*Performing the Functions and Duties of the*
*Under Secretary of Commerce for Intellectual Property and*
*Director of the United States Patent and Trademark Office*